(12) United States Patent
Jiang

(10) Patent No.: US 6,784,024 B2
(45) Date of Patent: Aug. 31, 2004

(54) DIE ATTACH CURING METHOD FOR SEMICONDUCTOR DEVICE

(75) Inventor: Tongbi Jiang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/960,945

(22) Filed: Sep. 25, 2001

(65) Prior Publication Data

US 2002/0060370 A1 May 23, 2002

Related U.S. Application Data

(62) Division of application No. 09/484,437, filed on Jan. 18, 2000.

(51) Int. Cl.[7] .......................... H01L 29/40; H01L 21/44
(52) U.S. Cl. ...................... 438/118; 257/782; 257/783
(58) Field of Search .......................... 438/118; 257/783, 257/787, 782

(56) References Cited

U.S. PATENT DOCUMENTS

| | | |
|---|---|---|
| 4,614,704 A | 9/1986 | Hung et al. |
| 5,100,767 A | 3/1992 | Yanagawa et al. |
| 5,190,995 A | 3/1993 | Shiobara et al. |
| 5,213,945 A | 5/1993 | Roos et al. |
| 5,296,334 A | 3/1994 | Castaldi et al. |
| 5,439,766 A | 8/1995 | Day et al. |
| 5,567,990 A | 10/1996 | Kawata et al. |
| 5,886,398 A * | 3/1999 | Low et al. .................. 257/667 |
| 5,915,169 A | 6/1999 | Heo |
| 5,925,499 A | 7/1999 | Hernandez et al. |
| 5,942,795 A * | 8/1999 | Hoang ........................ 257/692 |
| 6,221,691 B1 | 4/2001 | Schrock |
| 6,329,713 B1 * | 12/2001 | Farquhar et al. ............ 257/712 |
| 6,372,527 B1 * | 4/2002 | Khandros et al. ............. 438/15 |
| 2001/0013642 A1 * | 8/2001 | Jiang et al. .................. 257/676 |
| 2001/0015009 A1 * | 8/2001 | Heo ............................. 29/840 |
| 2002/0031868 A1 * | 3/2002 | Capote et al. ............. 438/126 |
| 2002/0062923 A1 * | 5/2002 | Forray ..................... 156/307.1 |
| 2002/0168798 A1 * | 11/2002 | Glenn et al. ................ 438/110 |

* cited by examiner

Primary Examiner—Kamand Cuneo
Assistant Examiner—James M. Mitchell
(74) Attorney, Agent, or Firm—Dickstein Shapiro Morin & Oshinsky LLP

(57) ABSTRACT

A low temperature cure adhesive material for affixing a solder mask to a die is described. The adhesive material is at least partially cured at temperatures below about 100° C. The low temperature curing lowers the thermal stresses on the adhesive, diminishes the possibility of voids being formed in the adhesive material, and increases the bond yield.

13 Claims, 5 Drawing Sheets

DIE ATTACH CURING METHOD FOR SEMICONDUCTOR DEVICE

This application is a divisional of application Ser. No. 09/484,437, filed on Jan. 18, 2000, the entire disclosure of which is hereby incorporated by reference.

FIELD OF THE INVENTION

The present invention generally relates to semiconductor device fabrication. More particularly, the present invention relates to the curing of an adhesive material used in affixing solder masks to semiconductor chips.

BACKGROUND OF THE INVENTION

Some conventional semiconductor devices include chips having a solder mask and printed or screened-on conductive traces for wirebonding to a ball grid array (BGA). Generally, the solder mask is affixed to the chip by an adhesive material. Typically, the adhesive material is applied to the chip and allowed to cure prior to deposition of the solder mask. Currently utilized adhesive materials cure at a temperature in excess of 150° C.

Most solder masks are formed from a liquid photoimageable material. Two popular solvents used in forming liquid photoimageable solder masks are diethylene glycol monoethyl ether acetate (DGMEA) and dipropylene glycol monoethyl ether (DGME). Often a heavy aromatic naphtha also is used as a photoinitiator. All of these materials boil at relatively high temperatures. Specifically, DGMEA boils at 219° C., DGME boils at 90° C., and naphtha boils at between 80° and 220° C.

Some currently used fabrication methods cure the adhesive material along with the solder mask. During such methods, a cure of about one hour at 150° C. of the liquid photoimageable solder mask is carried out. Such a cure serves to drive the low temperature volatile components of the solder mask, i.e., from the DGMEA and/or DGME, out, leaving behind the higher temperature volatiles to outgas later when the temperature of the device in operation reaches a sufficient outgassing temperature. Since the cure time and temperature are insufficient to cure the adhesive material, later outgassing may induce voids in the adhesive material. Voids are capable of entrapping moisture, causing the semiconductor package to fail an environmental test. Further, outgassing contaminates the bond pads, resulting in a low bond yield. In addition, curing at high temperatures creates thermal stresses between the adhesive material and the die which are particularly problematic for large and/or thin semiconductor device packages.

There exists a need for a curing methodology which inhibits the effects of outgassing on adhesive material, thereby reducing voiding and the collection of moisture within the adhesive material, as well as which reduces thermal stress on the device package and contamination of the bond pads.

SUMMARY OF THE INVENTION

The present invention provides a semiconductor device having a solder mask, a die and an adhesive layer affixing the die to the solder mask. The adhesive layer is cured at a temperature below about 100° C.

The present invention also provides a semiconductor device having a solder mask, a die, electrical contacts on the solder mask and the die, each contact on the die being wire bonded to a respective contact on the mask, and an adhesive layer affixing the die to the solder mask. The adhesive layer is cured at a temperature between about 20° C. and about 50° higher than a glassy temperature of the adhesive layer and the curing temperature is below about 100° C.

The present invention further provides a semiconductor package including a chip, a solder mask affixed to a die by an adhesive layer which is cured at a temperature below about 100° C., the die being electrically connected to the chip, and a mold encapsulating the chip, solder mask and die.

The present invention further provides a method of forming a semiconductor device. The method includes the steps of affixing a solder mask to a semiconductor die with an adhesive layer, and curing the adhesive layer by exposing the adhesive layer to a temperature no greater than 100° C.

These and other advantages and features of the invention will be more readily understood from the following detailed description of the invention which is provided in connection with the accompanying drawings.

DETAILED DESCRIPTION OF THE PREFERRED EMBODIMENTS

Figure 1:
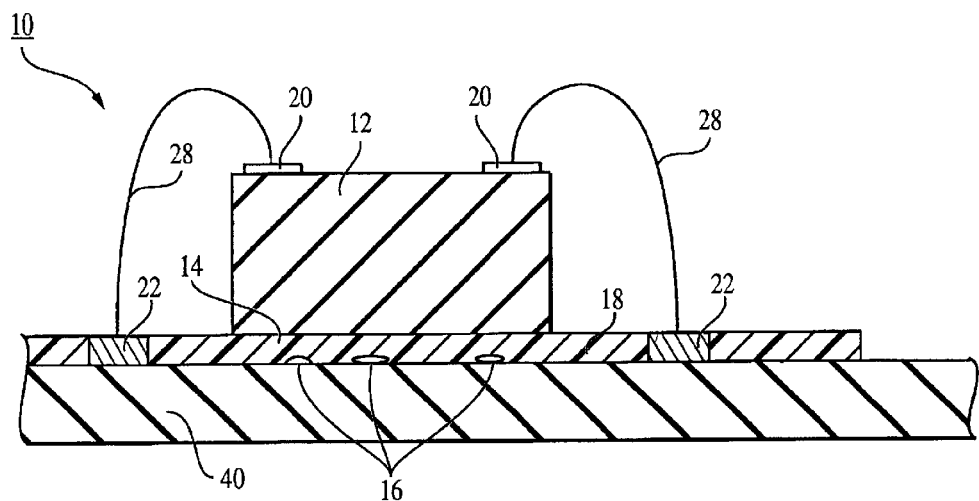
FIG. 1 is a cross-sectional view of a conventionally fabricated semiconductor chip on a printed circuit board.

FIG. 1 illustrates a conventionally fabricated semiconductor device 10, which includes a die 12 affixed to a solder mask 18 by an adhesive layer 14. The die 12 has contacts 20 in connection with contacts 22 on the solder mask 18. Specifically, each contact 20 is connected with a respective contact 22 through a wire bond 28. The solder mask 18 is affixed to a printed circuit board 40 or other substrate. The solder mask 18 contains DGMEA or DGME, or other materials. Further, a heavy aromatic naphtha may be used as a photoinitiator.

During the high temperature die attach adhesive curing, high temperature volatiles outgas from the solder mask 18 and/or the printed circuit board 40, forming voids 16 in the adhesive layer 14. As noted above, voids can trap moisture, causing the device 10 to fail an environmental test. Further, the outgassing may contaminate the contacts 20, 22, thereby decreasing the likelihood of a good bond therebetween.

Figure 2:
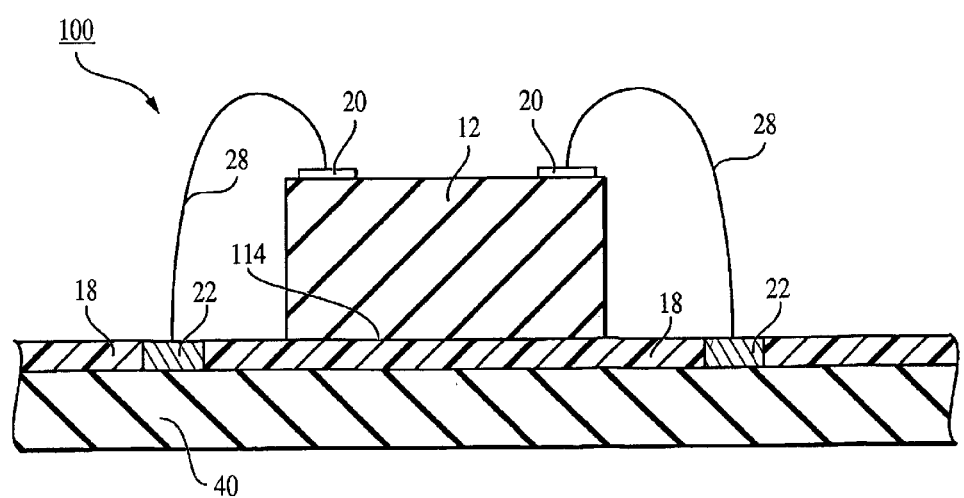
FIG. 2 is a cross-sectional view of a semiconductor chip on a printed circuit board fabricated in accordance with an embodiment of the invention.

The present invention obviates the problems caused by high temperature curing of the solder mask 18 by initially low temperature curing the adhesive layer. FIG. 2 shows a semiconductor device 100 formed in accordance with the present invention. The die 12 is affixed to the solder mask 18 by an adhesive layer 114. The layer 114 is subjected to a low temperature cure, for example, below 100° C., for a period of time to sufficiently solidify the adhesive layer 114, rendering it more impervious to the effects of outgassing.

Figure 3:
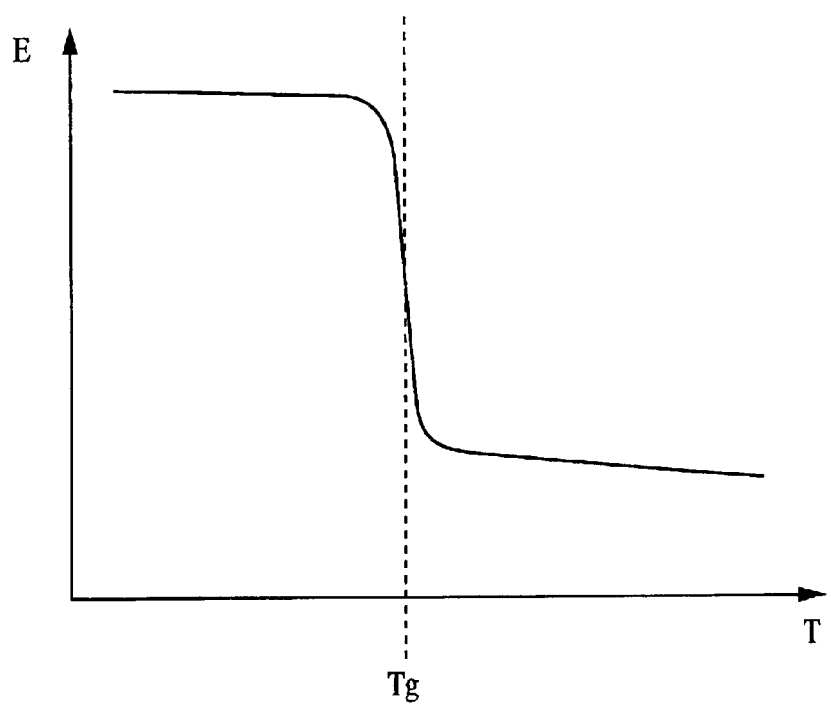
FIG. 3 is a graph of the change in the modulus of elasticity of an adhesive material over a temperature range.
Figure 4:
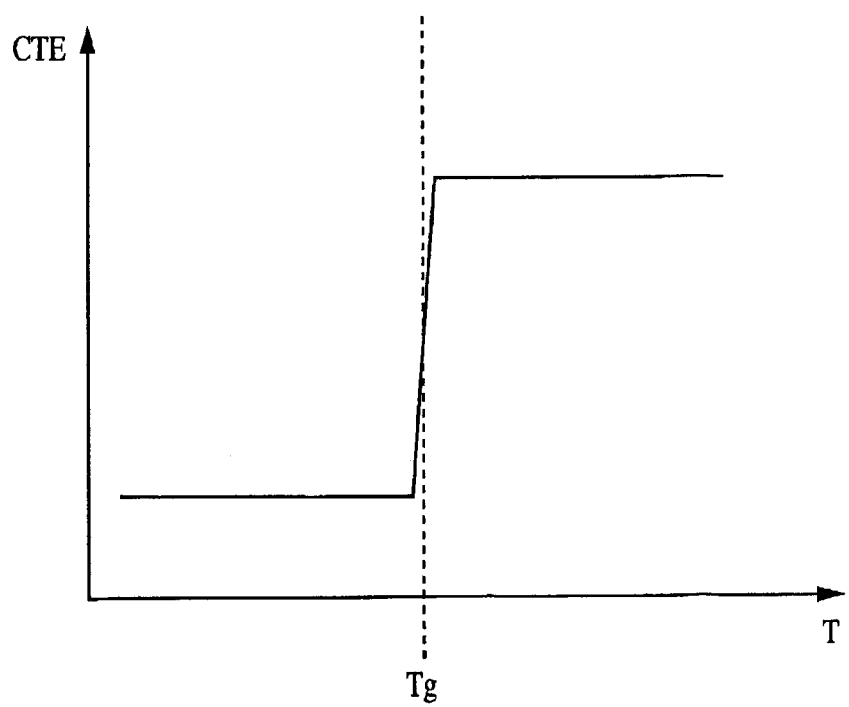
FIG. 4 is a graph of the change in the coefficient of thermal expansion of an adhesive material over a temperature range.

Referring now to FIGS. 3–4, there is a correlation between both the Young's Modulus (E) and the coefficient of thermal expansion (CTE). Specifically, there is a limited temperature range at which a material changes from a flexible/pliable state to a solid. At that same limited temperature range, a material's CTE is changed. This limited temperature range is called the glassy temperature $T_g$. The adhesive layer 14 (FIG. 1) is formulated such that its cure temperature is greater than or equal to its glassy temperature $T_g$, and since it cures at about 150° C., its $T_g$ is equal to or less than about 150° C.

The adhesive layer 114 is formulated to cure at a temperature below 100° C. A preferred formulation of the adhesive layer 114 includes one or more components which cure at or below 100° C. One such component is a resin bismaleimide. The bismaleimide may be the sole component in the layer 114 or it may be present in the adhesive layer 114 as a component. The adhesive layer 114 may include initiators which act as a catalyst to begin the curing at a lower temperature. One such initiator is peroxide, which upon being heated to a temperature below 100° C., releases free radicals. The free radicals start the chain polymerization.

Bismaleimide has a glassy temperature $T_g$ of between about 5° C. and about 10° C. To completely cure a resin, i.e., to fully cross-link the resin, a temperature of about 50° C. above the glassy temperature $T_g$ is required. Thus, an adhesive layer 114 formed of bismaleimide will cure at a temperature of about 70° C. A higher temperature would accelerate the curing process. Curing at temperatures below 100° C. reduces the stresses between the adhesive layer 114 and the die 12 and strengthens the adhesive layer 114 against voids 16 caused by outgassing. Further, a low temperature cure reduces the release of volatiles which can contaminate the contacts 20, 22, and thus a low temperature cure will provide a cleaner wire bonding site at the contacts 20, 22.

Figure 5:
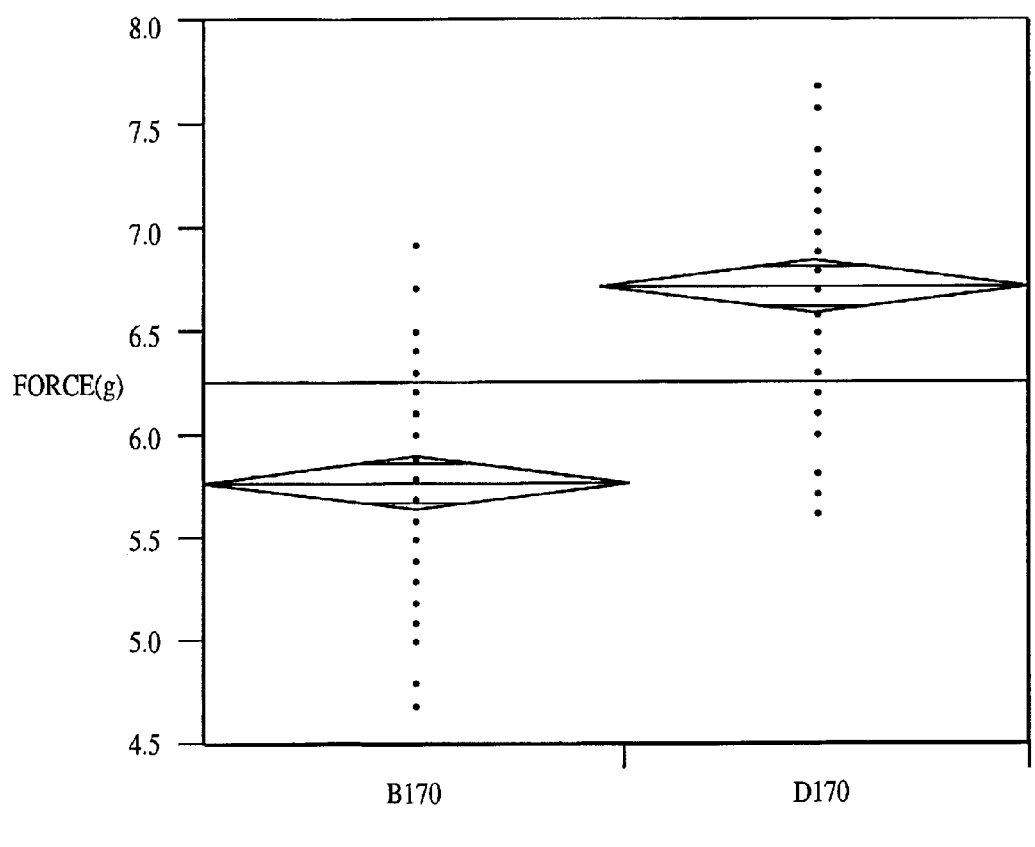
FIG. 5 is a graph depicting the wire bond pull force of an 80° C. cured adhesive material versus a 125° C. cured adhesive material.

One test to determine the viability of low temperature curing is to measure the wire pull force. Measuring the pull force allows one to ascertain which adhesives that are cured at low temperature perform similarly to adhesives which are cured at high temperatures. Typically, one would expect a lower force with a non-fully cured adhesive. Referring to FIG. 5, a pair of cured adhesives, B170 and D170, were stress tested. D170 is a die adhesive cured for four hours at 80° C., and B170 is a die adhesive cured at 125° for one hour (manufacturer's suggested cure profile). The force required to pull a wire bond of D170 free at 170° C. is approximately 6.75 grams, which measures favorably to the 5.75 grams for the B170 adhesive. This result indicates that a low temperature cure (below 100° C.) does not affect the mechanical strength of the material.

Figure 6:
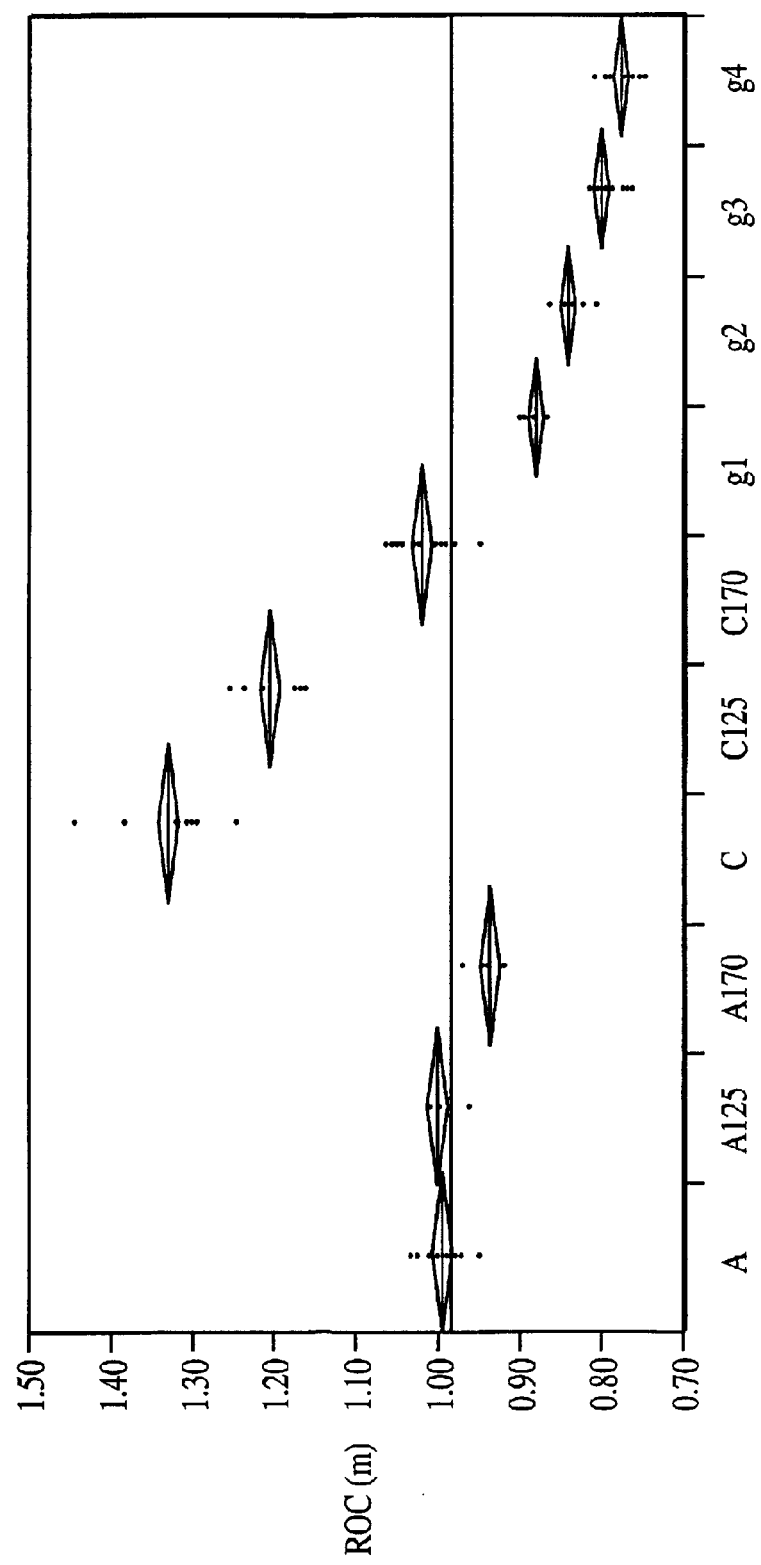
FIG. 6 is a graph depicting radii of curvature for various adhesive materials at various temperatures and curing times.

The stress of the adhesive may be determined by measuring the radius of curvature (ROC) measurement. The higher the stress of the adhesive, the lower the ROC. FIG. 6 illustrates the radius of curvature (ROC) of an adhesive material over a variety of conditions. Table 1 illustrates the various conditions.

TABLE 1

| Reference | Condition |
|---|---|
| A | cured at 125° for one hour. |
| A125 | cured at 125° for one hour and wire bonded at 125° C. |
| A170 | cured at 125° for one hour and wire bonded at 170° C. |
| C | cured at 80° for four hours. |
| C125 | cured at 80° C. for four hours and wire bonded at 125° C. |
| C170 | cured at 80° for four hours and wire bonded at 170° C. |
| G1 | cured at 150° C. for twenty minutes. |
| G2 | cured at 150° C. for forty minutes. |
| G3 | cured at 150° C. for one hour. |
| G4 | cured at 150° C. for two hours. |

As indicated in FIG. 6, the low temperature cured adhesive material 114, denoted as C, C125 and C170, shows a higher radius of curvature than the adhesive materials which were high temperature cured. As noted above, the higher the ROC the lower the stress of the adhesive FIG. 6 also indicates that as long as the adhesion is adequate, the curing of the adhesive layer 114 does not need to be complete. More curing can be accomplished at the following processes: wire bonding, encapsulation, solder reflow, and testing. It has been determined that the adhesive layer 114 subjected to a fifty percent cure exhibits sufficient adhesive strength to pass the package assembly process.

Figure 7:
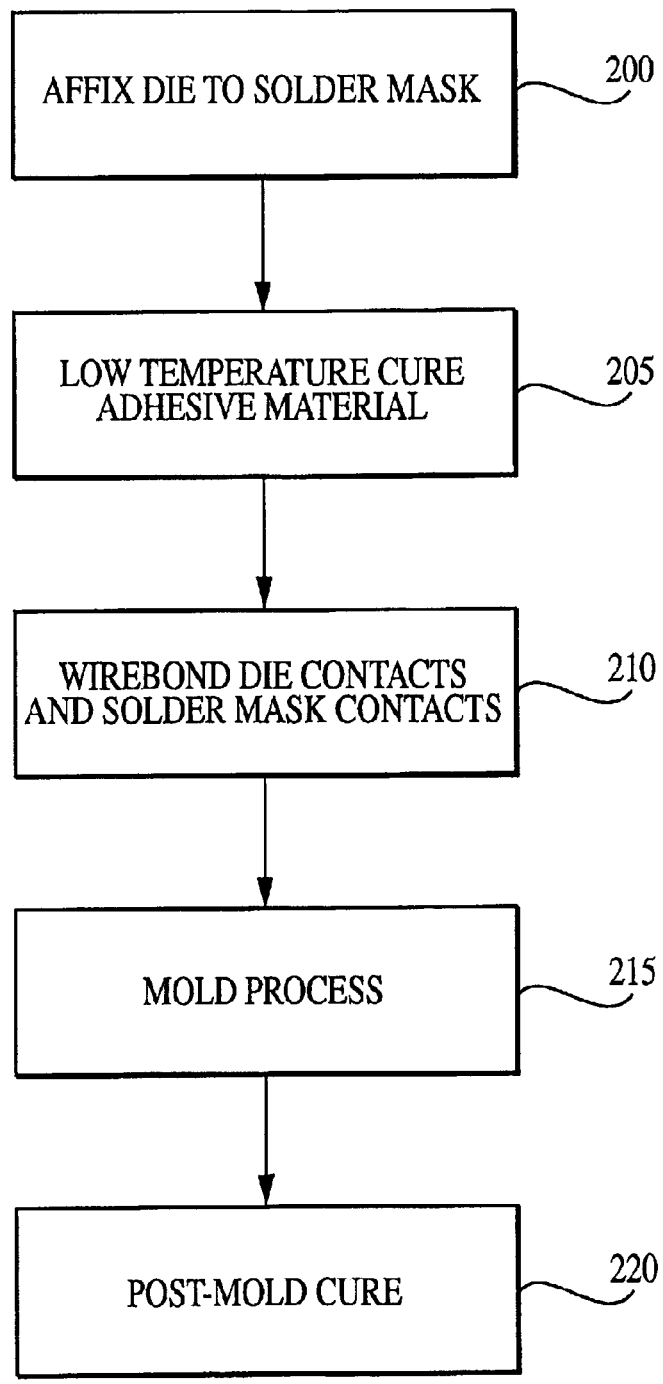
FIG. 7 illustrates a method of forming a semiconductor package in accordance with an embodiment of the present invention.

Referring to FIG. 7, next will be described a method for fabricating a semiconductor device package. The initial step 200 is to affix the die 12 to the solder mask 18 with the adhesive material 114. Then, the adhesive material 114 undergoes a low temperature cure at step 205. As indicated above, the low temperature cure is at a temperature below 100° C. The contacts 20 are electrically connected by the wire bonds 28 to the contacts 22 at step 210. The entire assemblage is encapsulated in a mold at step 215. The molding process is typically at a high temperature, for example, greater than or equal to about 180° C. An optional post mold cure is then provided at step 220. The post mold cure is typically at about 175° for about four hours.

If the adhesive material 114 is not completely cured during the low temperature cure step 205, it will become so during the subsequent heating steps 210, 220. High temperature curing, as noted above, may introduce high thermal stress. Nonetheless, the amount of thermal stress imparted to the adhesive material 114 is reduced since at least fifty percent of the adhesive material 114 is cured at a low temperature.

The present invention provides an adhesive material which is low temperature cured, thus reducing thermal stresses and the formation of voids. The present invention further provides a method for making a semiconductor device including such an adhesive material.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A method of making a semiconductor device comprising:

affixing a solder mask directly to a semiconductor die using an adhesive layer;

partially curing said adhesive layer by exposing said adhesive layer to a temperature no greater than 100° C.; and after said partially curing executing further package assembly processes prior to fully curing said adhesive layer.

2. The method of claim 1, wherein the step of executing further package assembly processes includes at least one of:

electrically connecting contacts on said die with contacts on said solder mask;

attaching a chip to said solder mask; and encapsulating said die, solder mask and chip with a mold.

3. The method of claim 2, wherein said mold encapsulates at a temperature of greater than about 100° C.

4. The method of claim 3, wherein said mold encapsulates at a temperature of about 180° C.

5. The method of claim 3, further comprising curing said mold.

6. The method of claim 5, wherein said mold curing is at about 175° C.

7. The method of claim 1, wherein said adhesive layer is partially cured at a temperature below about 85° C.

8. The method of claim 1, wherein said adhesive layer is at least fifty percent cured at a temperature below about 100° C.

9. The method of claim 1, wherein said adhesive layer is partially cured at a temperature between about 20° C. and about 50° C. higher than glassy temperature of said adhesive layer.

10. The method of claim 9, wherein said adhesive layer is partially cured at a temperature below about 85° C.

11. The method of claim 1, wherein the step of partially curing said adhesive layer takes place at a temperature above ambient.

12. The method of claim 11, wherein the step of partially curing said adhesive layer takes place at or above about 70° C.

13. The method of claim 12, wherein the step of partially curing said adhesive layer takes place at or above about 80° C.

* * * * *